(12) United States Patent
 Hollis et al.

(10) Patent No.: US 9,041,399 B2
(45) Date of Patent: May 26, 2015

(54) HELICAL GRADIENT COIL FOR MAGNETIC RESONANCE IMAGING APPARATUS

(75) Inventors: Timothy James Hollis, Bicester (GB); Fengshun Tan, Beijing (CN)

(73) Assignee: GE MEDICAL SYSTEMS GLOBAL TECHNOLOGY COMPANY, Waukesha, WI (US)

( * ) Notice: Subject to any disclaimer, the term of this patent is extended or adjusted under 35 U.S.C. 154(b) by 456 days.

(21) Appl. No.: 13/593,546

(22) Filed: Aug. 24, 2012

(65) Prior Publication Data
US 2013/0049755 A1 Feb. 28, 2013

(30) Foreign Application Priority Data

Aug. 31, 2011 (CN) .......................... 2011 1 0289173

(51) Int. Cl.
 *G01R 33/341* (2006.01)
 *G01R 33/385* (2006.01)
 *H01F 6/06* (2006.01)
 *G01R 33/421* (2006.01)
(52) U.S. Cl.
 CPC ............... *G01R 33/385* (2013.01); *H01F 6/06* (2013.01); *G01R 33/3854* (2013.01); *G01R 33/4215* (2013.01)
(58) Field of Classification Search
 CPC ............ G01R 33/385; G01R 33/3854; G01R 33/4215; H01F 6/06
 USPC .................. 324/300–322; 335/209, 246, 296; 336/189, 225–229
 See application file for complete search history.

(56) References Cited

U.S. PATENT DOCUMENTS

| 5,554,929 | A | 9/1996 | Doty et al. |
| 5,561,371 | A | 10/1996 | Schenk |
| 6,921,042 | B1 | 7/2005 | Goodzeit et al. |
| 7,880,578 | B2 * | 2/2011 | Meinke .......................... 336/188 |
| 7,889,042 | B2 | 2/2011 | Meinke |
| 7,889,046 | B2 | 2/2011 | Meinke |

FOREIGN PATENT DOCUMENTS

WO        2010071921 A1      7/2010

OTHER PUBLICATIONS

Search Report from corresponding GB Application No. GB1214783.1 dated Dec. 17, 2012.
Blaine A. Chronik, Andrew Alejski and Brian K. Rutt's "Design and Fabrication of a Three-Axis Edge ROU Head and Neck Gradient Coil", MRM, 44:955-963 (2000).

* cited by examiner

*Primary Examiner* — Dixomara Vargas
*Assistant Examiner* — Rishi Patel

(57) ABSTRACT

A gradient coil is provided. The gradient coil comprises: a first layer comprised of a first plurality of turns of wires; and a second layer of coil comprised of a second plurality of turns of wires. Each turn of wire in the first and second plurality of turns of wires circles along the side walls of a cylindrical substrate and each turn of wire in the first and second plurality of turns of wires include a first portion wound along the inner side wall of the substrate and a second portion wound along the outer side wall of the substrate.

41 Claims, 5 Drawing Sheets

HELICAL GRADIENT COIL FOR MAGNETIC RESONANCE IMAGING APPARATUS

BACKGROUND OF THE INVENTION

Embodiments of the present invention generally relate to the field of magnetic resonance imaging, and in particular, to a gradient coil for a magnetic resonance imaging apparatus.

The gradient coil of a Magnetic Resonance Imaging (MRI) apparatus provides a fast varying linear field gradient. Designers are constantly seeking ways to improve the efficiency of gradient coils within the constraints of driver compatibility and cost, while trying to maximize bore diameter and openness and minimize length.

The Lorentz force acting on the gradient coils may excite vibration modes and cause significant acoustic noise, which is uncomfortable for the patient and limits the operational performance of the scanner.

According to Faraday's Law, a time-varying magnetic field will induce an electric field E, which will, in turn, induce electric current in conducting structures. This may cause Peripheral Nerve Stimulation (PNS) or painful atrial fibrillation (which may be life-threatening)

In prior art, there are some gradient coil geometries that may be used to improve some aspects of performance or reduce acoustic noise; however, these geometries can be more difficult to manufacture or may compromise performance in other aspects.

U.S. Pat. No. 5,561,371 describes a folded gradient coil that can reduce the length of the coil and improve the performance of a transverse gradient coil by folding the return arc wires upon the forward arc wires. However, such coils are difficult to manufacture and there is a need to have multiple connections between the primary turns and the shield turns might cause reliability concerns. Furthermore, it would be extremely difficult to build this type of coil with hollow conductor.

U.S. Pat. No. 5,554,929 describes a crescent-shaped gradient coil with compact size and low acoustic noise. However, these coils are constrained to have the same number of the turns in the primary and shield making them inherently over-shielded, thus causing unwanted interactions with the magnet.

In Blaine A. Chronik, Andrew Alejski and Brian K. Rutt's "Design and Fabrication of a Three-Axis Edge ROU Head and Neck Gradient Coil", MRM, 44:955-963 (2000), an asymmetric gradient coil is described. While an asymmetric geometry may bring the Field of View (FOV) much closer to one end of the gradient coil, the lack of symmetry would pose many challenges including unwanted electromagnetic coupling and torque acting on the coil.

U.S. Pat. No. 6,921,042B1 describes a double helix magnet and possibility to create multi-polar fields. Concentric tilted double-helix magnets are obtained by winding complete tilted conductors on a core. U.S. Pat. No. 7,889,042B2 describes a particular implementation of the above with varying conductor width. While it is possible to create a quadrupole field with this configuration, such complete windings on a single core result in geometries with a long length and high impedance.

Therefore, there is a need for a novel geometry of a gradient coil that may improve the performance of the gradient coil, allow increased diameter and or openness of the bore, reduce the acoustic noise and reduce the tendency to cause PNS, without increasing the manufacturing costs, prohibiting the use of hollow conductor or compromising the performance in other aspects.

BRIEF DESCRIPTION OF THE INVENTION

According to an embodiment of the present invention a gradient coil is provided. The gradient coil comprises a first layer of coil comprised of a first plurality of turns of wires, and a second layer of coil comprised of a second plurality of turns of wires. The first plurality of turns of wires spirals in a substantially parallel trajectory along an inner side wall of a cylindrical substrate in a first helical direction from one of an upper edge and a lower edge of the cylindrical substrate to the other of the upper and lower edges, where the first plurality of turns of wires traverses the substrate and then spirals along an outer side wall of the cylindrical substrate in a second helical direction to the one of the upper edge and the lower edge, so that each turn of wire in the first plurality of turns of wires circles along the side walls of the cylindrical substrate and includes a first portion wound along the inner side wall and a second portion wound along the outer side wall. The second plurality of turns of wires spirals in a substantially parallel trajectory along the inner side wall of the cylindrical substrate in the second helical direction from one of the upper and lower edges of the cylindrical substrate to the other of the upper and lower edges, where the second plurality of turns of wires traverses the substrate and then spirals along the outer side wall of the cylindrical substrate in the first helical direction to the one of the upper and lower edges, so that each turn of wire in the second plurality of turns of wires circles along the side walls of the cylindrical substrate and includes a first portion wound along the inner side wall and a second portion wound along the outer side wall.

According to another embodiment of the present invention, an MR apparatus is provided. The MR apparatus comprises an X gradient coil and a Y gradient coil, wherein the X gradient coil and Y gradient coil are gradient coils comprising a first layer of coil comprising a first plurality of turns of wires; and a second layer of coil comprising a secondary plurality of turns of wires. The first plurality of turns of wires spirals in a substantially parallel trajectory along an inner side wall of a cylindrical substrate in a first helical direction from one of an upper edge and a lower edge of the cylindrical substrate to the other of the upper and lower edges, where the first plurality of turns of wires traverses the substrate and then spirals along an outer side wall of the cylindrical substrate in a second helical direction to the one of the upper edge and the lower edge, so that each turn of wire in the first plurality of turns of wires circles along the side walls of the cylindrical substrate and includes a first portion wound along the inner side wall and a second portion wound along the outer side wall. The second plurality of turns of wires spirals in a substantially parallel trajectory along the inner side wall of the cylindrical substrate in the second helical direction from one of the upper and lower edges of the cylindrical substrate to the other of the upper and lower edges, where the second plurality of turns of wires traverses the substrate and then spirals along the outer side wall of the cylindrical substrate in the first helical direction to the one of the upper and lower edges, so that each turn of wire in the second plurality of turns of wires circles along the side walls of the cylindrical substrate and includes a first portion wound along the inner side wall and a second portion wound along the outer side wall.

BRIEF DESCRIPTION OF THE DRAWINGS

For a more thorough understanding of the contents of this disclosure, reference is now made to the following description, taken in conjunction with the accompanying drawings, in which.

DETAILED DESCRIPTION OF THE INVENTION

Specific embodiments of the present invention will be described in detail below, but the present invention should not be limited to these specific embodiments.

Figure 1:
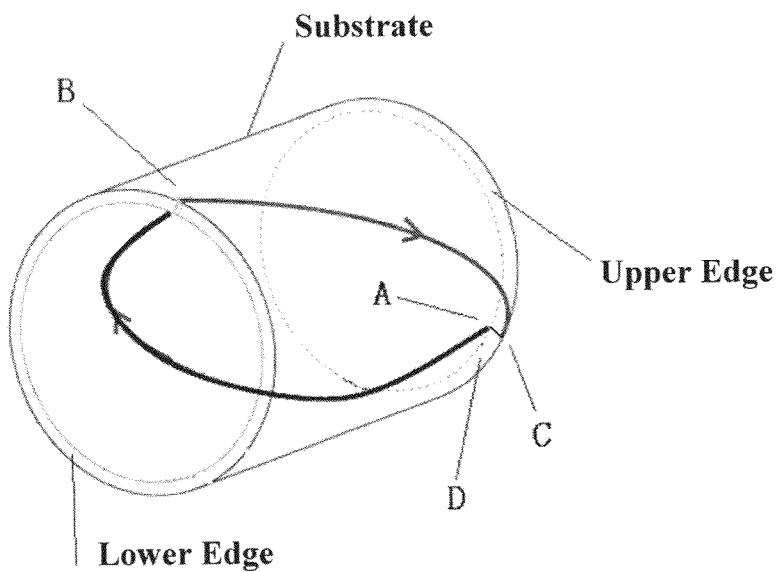
FIG. 1 is a schematic diagram illustrating a single turn wire of a gradient coil according to an embodiment of the present invention.

FIG. 1 illustrates a schematic diagram of a single turn wire of a gradient coil according to an embodiment of the present invention. As shown in FIG. 1, the single turn wire spirals along the inner side wall of the substrate in a left-handed direction with respect to the point A from the point A on the upper edge of the cylindrical substrate of the gradient coil to the point B on the lower edge, traverses the substrate from the inner side wall to the outer side wall at the point B, and continues to spiral along the outer side wall in a right-handed direction with respect to the point A to the point C on the upper edge of the cylindrical substrate. The directions of arrows in the figure represent the winding directions. The azimuthal angle from the point A to the point C in the winding direction of the wire is about 360 degrees. Accordingly, the single turn wire circles along the side walls of the cylindrical substrate. As shown in FIG. 1, the azimuthal angle subtended by the wire portion AB along the inner side wall of the substrate is larger than the azimuthal angle subtended by the wire portion BC along the outer side wall of the substrate. In other words, the azimuthal angle subtended by the wire portion BC is less than 180 degrees. The embodiment above takes the wire portion AB wound in a left-handed direction with respect to the point A and the wire portion BC wounded in a right-handed direction with respect to the point A as an example. In an alternative embodiment, the wire portion AB may be wound in a right-handed direction, and the wire portion BC in a left-handed direction. In addition, although it is illustrated that the winding starts from a point on the upper edge, it may be appreciated that the winding may also start from a point on the lower edge.

With a next turn of wire, the end C of the wire portion BC will traverse the side wall of the substrate to reach a point D on the lower edge, the point D being on the inner side wall of the substrate and adjacent to the point A (as shown in FIG. 1). The wire is wound along the side walls of the substrate in the trajectory substantially parallel to the wire ABC starting from the point D, thus forming another turn of wire. A plurality of turns of wires are wound along the side walls of the substrate in the above-mentioned way. The trajectories of the plurality of turns of wires that form a first layer of coil of the gradient coil along the inner and outer side walls of the substrate are substantially parallel. Each of the plurality of turns of wires circles along the side walls of the cylindrical substrate and includes a first portion that is wound along the inner side wall and a second portion that is wound along the outer side wall, and the azimuthal angle subtended by the first portion is larger than the azimuthal angle subtend by the second portion.

Figure 2:
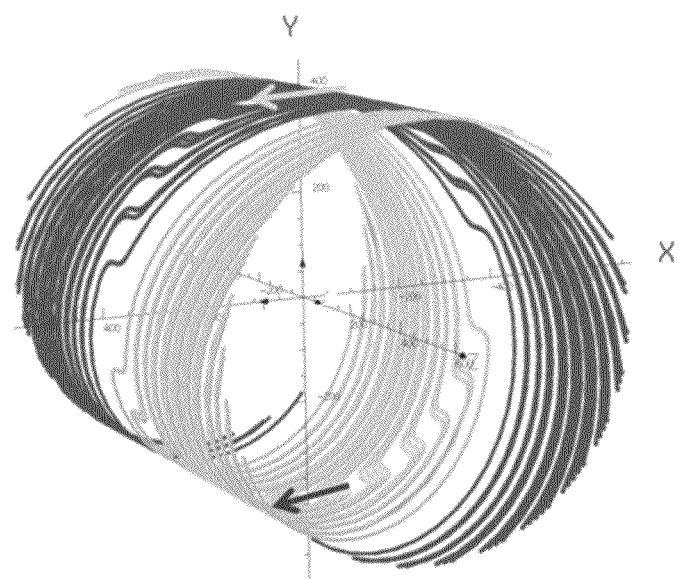
FIG. 2 is a schematic diagram illustrating the inner portion of a first plurality of turns of a first layer according to an embodiment of the present invention.

FIG. 2 illustrates the inner portion of the first and second layers, without showing the substrate for the sake of clarity.

Figure 3:
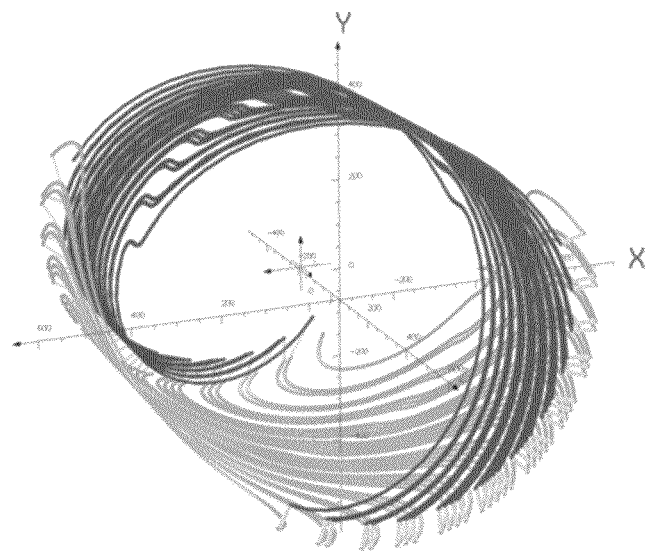
FIG. 3 is a schematic diagram illustrating a complete winding of a first half of the first plurality of turns of wires of a first layer according to an embodiment of the present invention.

FIG. 3 illustrates a complete winding of a first half of a first layer, without showing the substrate for the sake of clarity. As shown in FIG. 3, the plurality of turns of wires that constitute the first layer of the primary coil spiral in a counter-clockwise direction from the lower edge of the substrate to the upper edge and the plurality of turns of wires that constitute the first layer of the shield coil continue to spiral in a counter-clockwise direction from the lower edge of the substrate to the upper edge.

Figure 4:
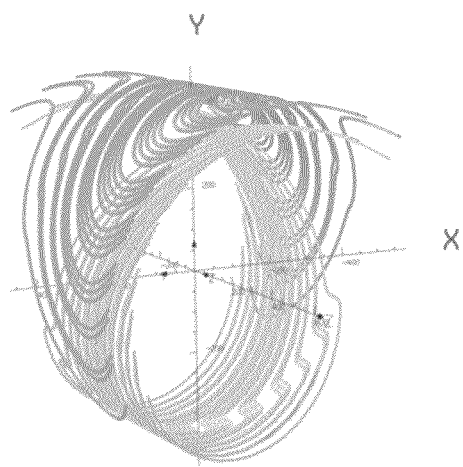
FIG. 4 is a schematic diagram illustrating a complete winding of a second half of the first plurality of turns of wires of a first layer according to an embodiment of the present invention.

FIG. 4 illustrates a complete winding of a second half of a first layer, without showing the substrate for the sake of clarity. As shown in FIG. 4, the plurality of turns of wires that constitute the first layer of the primary coil spiral in a counter-clockwise direction from the lower edge of the substrate to the upper edge and the plurality of turns of wires that constitute the first layer of the shield coil continue to spiral in a counter-clockwise direction from the lower edge of the substrate to the upper edge.

Figure 5:
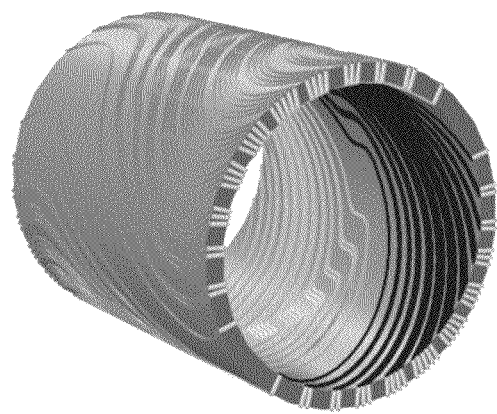
FIG. 5 is a schematic diagram illustrating a complete winding of a first plurality of turns of wires of a first layer according to an embodiment of the present invention.

FIG. 5 illustrates a complete winding of a first layer, without showing the substrate for the sake of clarity.

The explanations are given above with respect to the first layer of helical coil. In at least one embodiment of the present invention, a two layer helical coil is introduced. The second layer of helical coil is also comprised of a plurality of turns of wires, each of the plurality of turns of wires circling along the side walls of the substrate in a substantially parallel trajectory. Similar to the first layer of helical coil, each turn of wire of the second layer of helical coil also includes a first portion that spirals along the inner side wall of the substrate from one edge to the other edge of the substrate and the second portion that runs along the outer side wall of the substrate from the other edge to the one edge of the substrate, and the azimuth angle subtending the first portion is larger than the azimuth angle subtending the second portion. Unlike the first layer of helical coil, the helical direction in which the first portion of each turn of wire in the second layer of helical coil is wound along the inner wall of the substrate is opposite to the helical direction in which the first portion of each turn of wire in the first layer of helical coil is wound, and the helical direction in which the second portion of each turn of wire in the second layer of helical coil is wound along the outer wall of the substrate is also opposite to the helical direction in which the second portion of each turn of wire in the first layer of helical coil is wound so that the first portion of each turn of wire in the first layer of helical coil and the first portion of each turn of wire in the second layer of helical coil are superimposed to form a mesh on the inner side wall of the substrate and the second portion of each turn of wire in the first layer of helical coil and the second portion of each turn of wire in the second layer of helical coil are also superimposed to form a mesh on the outer side wall of the substrate. For example, if the first portion of each turn of wire in the first layer of helical coil is wound in a left-handed direction and the second portion thereof in a right-handed direction, the first portion of each turn of wire in the second layer of helical coil is wound in a right-handed direction and the second portion thereof in a left-handed direction.

Figure 6:
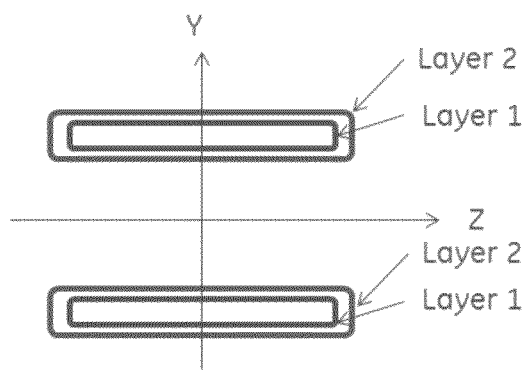
FIG. 6 is a schematic diagram illustrating a cross section of a first and second layer according to an embodiment of the present invention.

FIG. 6 illustrates a cross section of a first and second layer of a helical coil, without showing the substrate for the sake of clarity. Among the plurality of turns of wires that constitute the second layer of helical coil, the first portions wound along the inner side wall form the second layer of primary coil, and the second portions wound along the outer side wall form the second layer of shield coil.

Figure 7:
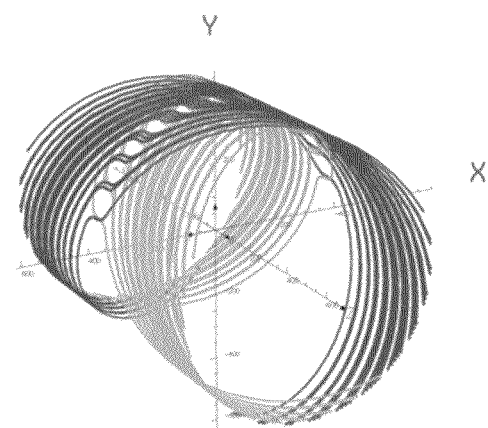
FIG. 7 is a schematic diagram illustrating the inner portion of a first half of a first plurality of turns of a first layer and the inner portion of a first half of a second plurality of turns of a second layer according to an embodiment of the present invention.

FIG. 7 illustrates a schematic diagram of the inner portion of a first half of a first plurality of turns of a first layer and the inner portion of a first half of a second plurality of turns of a second layer without showing the substrate for the sake of clarity. As may be seen from FIG. 7, since the helical directions of the first portion of each turn of wire in the first layer of helical coil and the second layer of helical coil are opposite to each other, each of wires in the first layer of primary coil and each of wires in the second layer of primary coil are superimposed to form a mesh. If the directions of currents from the first layer of helical coil and the second layer of helical coil are the same, i.e., both in the counter clockwise direction or both in the clockwise direction, the components, in Z direction (i.e., the axial direction of the substrate), of current vectors for each of wires in the first layer of primary coil and the wires of the second layer of primary coil may partially or completely be cancelled. By adjusting the trajectory direction of each wire and/or the amount of current, the component of current in Z direction in the first layer of primary coil and the second layer of primary coil can reach zero. In addition, by adjusting the trajectory direction of each wire and/or the amount of current, the component of current in the azimuthal direction (i.e., the circumferential direction of the side wall of the substrate) in the first layer of primary coil and the second layer of primary coil are further adjusted so as to minimize the leakage field.

Figure 8:
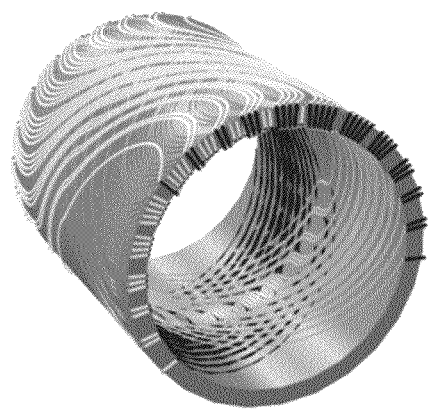
FIG. 8 is a schematic diagram illustrating a complete winding of a first half of first plurality of turns of a first layer and a complete winding of a first half of a second plurality of turns of a second layer according to an embodiment of the present invention.

FIG. 8 illustrates a schematic diagram of a complete winding of a first half of first plurality of turns of a first layer and a complete winding of a first half of a second plurality of turns of a second layer without illustrating the substrate for clarity. Similar to the first and second layer of primary coils, since the helical direction of the second portion of each turn of wire in the first layer of helical coil and the second layer of helical coil are opposite to each other, each of wires in the first layer of shield coil and each of wires in the second layer of shield coil are superimposed to form a mesh. Similarly, by adjusting the trajectory direction of each wire and/or the amount of current, the component of current in the Z direction in the first layer of shield coil and the second layer of shield coil can reach zero, and the leakage field can be minimized. Since the angle subtended by each wire of the shield coil in the circumferential direction of the side wall of the substrate is less than 180 degrees, each wire has a smaller current component in the circumferential direction compared to that in each wire of the primary coil, which will enable the realization of an excellent shielding performance.

In an embodiment of the invention, the gradient coil further comprises passive shims which are co-planar with the first and or second layers of coils and inserted in a spiral trajectory parallel to the wires of the first and/or second layers of coils, wherein low order passive shims are located on the ends of the gradient coil. Slots for passive shims can run between the inner or primary windings and the returning outer or shield windings.

In an embodiment of the invention, the substrate of the gradient coil is sub-divided such that multiple helical gradient coils can be arranged in series along the length of the substrate which might be advantageous for certain applications. In another embodiment of the invention, conductors cross between the first and second layers of coils or electrical connections are made between the first and second layers of coils.

According to an embodiment, the wires of the gradient coil are single-filamentary conductor, multi-filamentary conductor, hollow conductor or machined from metal plate. According to another embodiment, the wires of the gradient coil are manufactured from electrically conductive materials such as copper, aluminum or alloys comprising copper or aluminum. In another embodiment, the wires of the gradient coil are wound from a high or low temperature superconducting material.

According to an embodiment of the invention, some wires of the gradient coil can be selected so that the wires can be switched or changed polarity to change the size, shape or position of the field of view. In another embodiment, some wires of the gradient coil are selected so that the wires can be driven in parallel.

In an embodiment of the invention, slots can be cut into the ends of the substrate such that some wires of the gradient coil can transition from primary to shield before they reach the end of the substrate which can increase the efficiency of the coil. In another embodiment, cut-outs are made into the end of the substrate to accommodate shoulders of a patient.

In an embodiment of the invention, the gradient coil further comprises cooling tubes which are wound in a spiral configuration, between the wires of the gradient coil.

Figure 11:
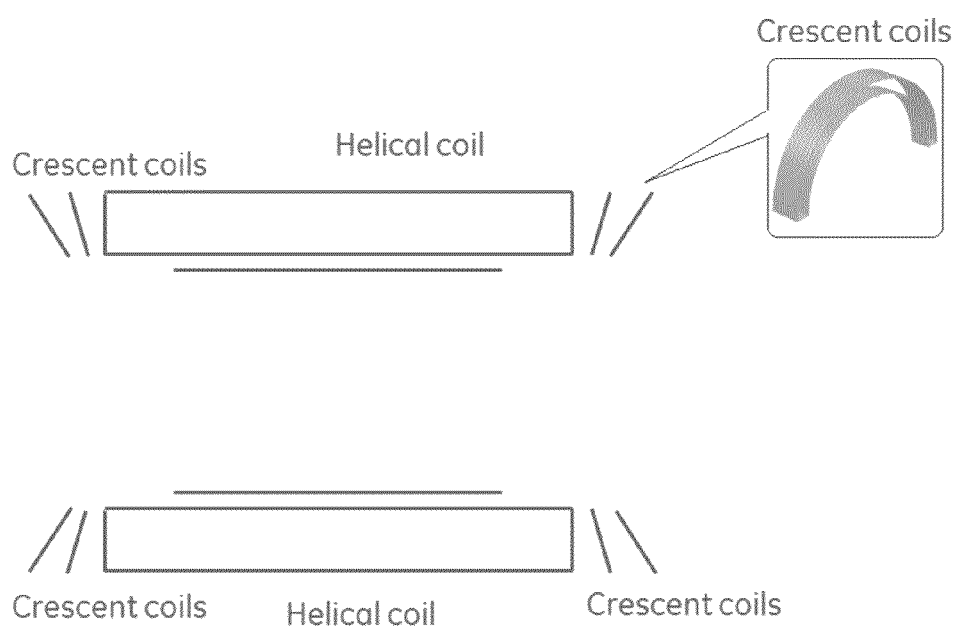
FIG. 11 schematically shows an embodiment of the helical gradient coil according to an embodiment of the present invention combined with a crescent coil.

The gradient coil as described in the above can be combined with conventional Golay windings or Crescent coils (as shown in FIG. 11).

According to at least one embodiment of the present invention, each turn of wire in the primary coil and the shield coil is wound as a spiral, and two spirals are joined together at the ends of the gradient coil. Thus, the current vectors of each turn of wire in the primary coil and the shield coil have an azimuthal component and a Z component. With the use of a double layer helical coil, the Z components of currents may be cancelled between the layers of the primary coil and the shield coil. By varying the azimuthal component of the current vector between the primary coil and the shield coil, the leakage field can be minimized. Importantly, since the azimuthal angle subtended by the arc of the primary coil is larger than the azimuthal angle subtended by the arc of the shield coil, such design has significantly improved performance, reduced physical size, lower acoustic noise, and reduced tendency to cause PNS.

Preliminary studies have shown that helical coil has significantly reduced physical size, improved performance and it is expected to create less vibration and acoustic noise compare to a conventional gradient. The helical geometry lends itself to a wire wound manufacturing technique where the primary and shield coils are wound with a continuous length of wire, resulting in far fewer soldered joints than a traditional folded gradient geometry and thereby reducing manufacturing cost and improving reliability.

Figure 9:
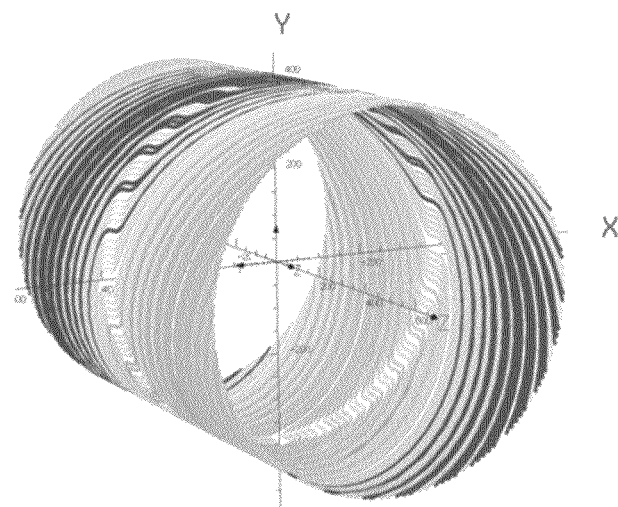
FIG. 9 is a schematic diagram illustrating the inner portion of a first plurality of turns of a first layer of an X coil and Y coil which are interleaved according to an embodiment of the present invention.

MR apparatus typically comprises X, Y and Z gradient coils. According to an embodiment of the invention, wires of each of the X and Y gradient coils are wound in a spiral configuration as described in the above. The X gradient coil is exactly the same as the Y gradient coil except the geometry is rotates by 90 degree and, as can be seen in FIG. 9, it is possible to nest wires of the X gradient coil in the gaps of wires of the Y gradient coil so that they are occupying the same radial space. This avoids the need to have two substrates respectively for the X and Y gradient coils. That is, the Y gradient coil shares the same substrate with the X gradient coil, wherein wires of the Y gradient are interleaved with those of the X gradient coil. In an embodiment of the invention, the X and Y gradient coils have a geometry which is asymmetric about the XY plane which is defined with X and Y axes. By adjusting the angle formed between crossed wires of the first and second layers of coils and the magnitude of current, suitable magnetic gradient fields can be obtained in X and Y axes. FIG. 9 illustrates the inner portion of a first plurality of turns of the first layer of the X and Y gradient coil which share the same substrate (not shown) as mentioned in the above. In an embodiment of the invention, the Z gradient coil of the MR apparatus is also a gradient coil as described in the above. Alternatively, the Z gradient coil can be encapsulated or partially encapsulated inside the X and Y gradient coils, and might not share the same substrate with the X and Y coil.

The configuration of the coils makes it possible that the central portion of the bore of the MR apparatus can be bulged to allow reduced claustrophobia or installation of RF coil or additional imaging equipment such as a PET scanner or a focused ultrasound device.

In an embodiment of the invention, the bore is non-cylindrical such as elliptical or the bottom potion of the bore is elliptical or flattened to bring conductors under the patient bed of the MR apparatus closer to the field of view to increase efficiency of the coil.

Figure 10:
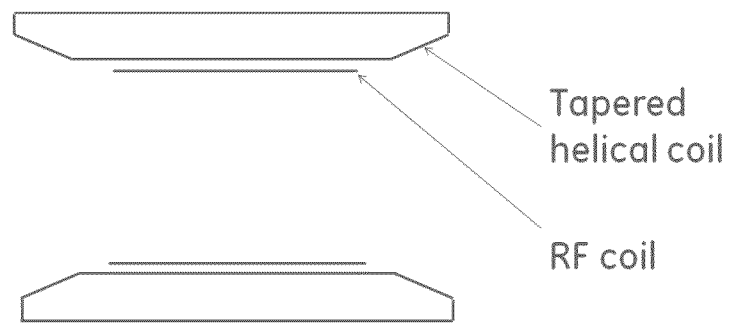
FIG. 10 shows the tapered bore configuration with the helical gradient coil according to an embodiment of the present invention.

In an embodiment of the invention, the bore of the gradient has a tapered entry to increase openness, as shown in FIG. 10.

The MR apparatus optionally comprises room temperature shim coils which are encapsulated or partially encapsulated inside the X and Y gradient coils. According to an embodiment of the present invention, the azimuthal angle subtended by the first portion of each turn of wire in the first plurality of turns of wires and the second plurality of turns of wires is larger than an azimuthal angle subtended by the second portion thereof.

According to an embodiment of the present invention, the first portion of each turn of wire in the first plurality of turns of wires and the second plurality of turns of wires forms a primary coil of the gradient coil, and wherein the second portion of each turn of wire in the first plurality of turns of wires and the second plurality of turns of wires forms a shield coil of the gradient coil.

According to an embodiment of the present invention, the first helical direction and the second helical direction are opposite to each other.

According to an embodiment of the present invention, the first helical direction is a left-handed direction, and the second helical direction is a right-handed direction.

According to an embodiment of the present invention, the first helical direction is a right-handed direction, and the second helical direction is a left-handed direction.

According to an embodiment of the present invention, the second portion of each turn of wire in the first plurality of turns of wires and the second plurality of turns of wires traverses the substrate and is connected to the first portion of the next turn of wire.

According to an embodiment of the present invention, a direction of a current in the first layer of coil is the same as that of a current in the second layer of coil.

According to an embodiment of the present invention, both the direction of the current in the first layer of coil and the direction of the current in the second layer of coil are a counter clockwise direction.

According to an embodiment of the present invention, both the direction of the current in the first layer of coil and the direction of the current in the second layer of coil are a clockwise direction.

According to an embodiment of the present invention, the first portion of each turn of wire in the first plurality of turns of wires and the first portion of each turn of wire in the second plurality of turns of wires are interweaved into a mesh on the inner side wall of the substrate, and wherein the second portion of each turn of wire in the first plurality of turns of wires and the second portion of each turn of wire in the second plurality of turns of wires are -superimposed to form a mesh on the outer side wall of the substrate.

According to an embodiment of the present invention, the first layer of coil and the second layer of coil are configured such that the primary coil and the shield coil have substantially zero current components in an axial direction of the substrate.

According to an embodiment of the present invention, the first layer of coil and the second layer of coil are configured such that the primary coil and the shield coil have current components in a circumferential direction of the side walls of the substrate that minimize a leakage field.

According to an embodiment of the present invention, the gradient coil is X gradient coil.

According to an embodiment of the present invention, the gradient coil is Y gradient coil.

According to an embodiment of the present invention, the gradient coil is Z gradient coil.

According to an embodiment of the present invention, the gradient coil further comprises passive shims which are coplanar with the first and or second layers of coils and inserted in a spiral trajectory parallel to the wires of the first and or second layers of coils.

According to an embodiment of the present invention, slots for passive shims run between wires of the primary and shield coils.

According to an embodiment of the present invention, low order passive shims are located on the ends of the gradient coil.

According to an embodiment of the present invention, the gradient coil is combined with conventional Golay windings or Crescent coils.

According to an embodiment of the present invention, conductors cross between the first and second layers of coils or electrical connections are made between the first and second layers of coils.

According to an embodiment of the present invention, slots are cut into the ends of the substrate such that some wires of the gradient coil do not reach the end.

According to an embodiment of the present invention, cut-outs are made into the end of the substrate to accommodate shoulders of a patient.

According to an embodiment of the present invention, some wires of the gradient coil are selected so that said wires can be switched or changed polarity to change the size, shape or position of the field of view.

According to an embodiment of the present invention, some wires of the gradient coil are selected so that said wires can be driven in parallel.

According to an embodiment of the present invention, the substrate is sub-divided such that multiple gradient coils can be arranged in series along the length of the substrate.

According to an embodiment of the present invention, the wires of the gradient coil are hollow conductor, multi-filamentary conductor or machined from metal plate.

According to an embodiment of the present invention, the wires of the gradient coil are manufactured from electrically conductive materials.

According to an embodiment of the present invention, the electrically conductive materials include copper, aluminum or alloys comprising copper or aluminum.

According to an embodiment of the present invention, the wires of the gradient coil are wound from a high or low temperature superconducting material.

According to an embodiment of the present invention, the gradient coil further comprises cooling tubes which are wound in a spiral configuration, between the wires of the gradient coil.

According to an embodiment of the present invention, the Y gradient coil shares the same substrate with the X gradient coil and wherein the wires of the Y gradient are interleaved with those of the X gradient coil.

According to an embodiment of the present invention, the MR apparatus further comprises Z gradient coil which is also a gradient coil as recited in claim 1.

According to an embodiment of the present invention, the Z gradient coil is encapsulated or partially encapsulated inside the X and Y gradient coils.

According to an embodiment of the present invention, the MR apparatus further comprises room temperature shim coils which are encapsulated or partially encapsulated inside the X and Y gradient coils.

According to an embodiment of the present invention, the X and Y gradient coils have a geometry which is asymmetric about the XY plane.

According to an embodiment of the present invention, the MR apparatus further comprises a bore of which central portion is bulged to allow reduced claustrophobia or installation of RF coil or additional imaging equipment.

According to an embodiment of the present invention, the additional imaging equipment includes a PET scanner or a focused ultrasound device.

According to an embodiment of the present invention, the bore has a tapered entry to increase openness.

According to an embodiment of the present invention, the bore is elliptical or bottom potion of the bore is elliptical or flattened to bring conductors under a patient bed of the MR apparatus closer to the field of view.

At least one embodiment of the present invention employs a helical geometry for the gradient coil, and a double layer helical coil, so that the z components of the current (the current components in the axial direction of the substrate) can be cancelled between the two layers. By varying the phi components (the current components in the circumferential direction of the side wall of the substrate) of the current vectors between the primary and shield coils, may minimize the leakage field, thereby reducing interaction between the gradient coil and the magnet. To facilitate this, the azimuthal angle subtended by the arc of the primary coil is usually larger than the azimuthal angle subtended by the arc of the shield coil. Conductors are further provided which are orientated in a substantially longitudinal direction, significantly increasing the stiffness of the structure.

The gradient coil of the embodiments of the present invention herein described has reduced size, improved openness, reduced acoustic noise, reduced possibility of PNS and it is practical to wind with single-filamentary conductor, multi-filamentary conductor or hollow conductor. Furthermore, embodiments of the present invention may be applied to a symmetrical or near-symmetrical head gradient design.

While specific embodiments of the present invention are described above with reference to accompanying drawings, it will be understood by those skilled in the art that various changes, modifications and equivalent alterations thereof may be made, without departing from the scope of the disclosure. These changes, modifications and equivalent alterations are intended to fall within the spirit and scope as defined by the appended claims.

What is claimed is:

1. A gradient coil comprising:
   a first layer of coil comprised of a first plurality of turns of wires, wherein the first plurality of turns of wires spirals in a substantially parallel trajectory along an inner side wall of a cylindrical substrate in a first helical direction from one of an upper edge and a lower edge of the cylindrical substrate to the other of the upper and lower edges, where the first plurality of turns of wires traverses the substrate and then spirals along an outer side wall of the cylindrical substrate in a second helical direction to the one of the upper edge and the lower edge, so that each turn of wire in the first plurality of turns of wires circles along the side walls of the cylindrical substrate and includes a first portion wound along the inner side wall and a second portion wound along the outer side wall; and
   a second layer of coil comprised of a second plurality of turns of wires, wherein the second plurality of turns of wires spirals in a substantially parallel trajectory along the inner side wall of the cylindrical substrate in the second helical direction from one of the upper and lower edges of the cylindrical substrate to the other of the upper and lower edges, where the second plurality of turns of wires traverses the substrate and then spirals along the outer side wall of the cylindrical substrate in the first helical direction to the one of the upper and lower edges, so that each turn of wire in the second plurality of turns of wires circles along the side walls of the cylindrical substrate and includes a first portion wound along the inner side wall and a second portion wound along the outer side wall.

2. The gradient coil according to claim 1, wherein the first portion of each turn of wire in the first plurality of turns of wires and the second plurality of turns of wires forms a primary coil of the gradient coil, and wherein the second portion of each turn of wire in the first plurality of turns of wires and the second plurality of turns of wires forms a shield coil of the gradient coil.

3. The gradient coil according to claim 1, wherein the first helical direction and the second helical direction are opposite to each other.

4. The gradient coil according to claim 3, wherein the first helical direction is a left-handed direction, and the second helical direction is a right-handed direction.

5. The gradient coil according to claim 3, wherein the first helical direction is a right-handed direction, and the second helical direction is a left-handed direction.

6. The gradient coil according to claim 1, wherein the second portion of each turn of wire in the first plurality of turns of wires and the second plurality of turns of wires traverses the substrate and is connected to the first portion of the next turn of wire.

7. The gradient coil according to claim 1, wherein a direction of a current in the first layer of coil is the same as that of a current in the second layer of coil.

8. The gradient coil according to claim 7, wherein both the direction of the current in the first layer of coil and the direction of the current in the second layer of coil are a counter clockwise direction.

9. The gradient coil according to claim 7, wherein both the direction of the current in the first layer of coil and the direction of the current in the second layer of coil are a clockwise direction.

10. The gradient coil according to claim 1, wherein the first portion of each turn of wire in the first plurality of turns of wires and the first portion of each turn of wire in the second plurality of turns of wires are superimposed to form a mesh on the inner side wall of the substrate, and wherein the second portion of each turn of wire in the first plurality of turns of wires and the second portion of each turn of wire in the second plurality of turns of wires are superimposed to form a mesh on the outer side wall of the substrate.

11. The gradient coil according to claim 2, wherein the first layer of coil and the second layer of coil are configured such that the primary coil and the shield coil have substantially zero current components in an axial direction of the substrate.

12. The gradient coil according to claim 2, wherein the first layer of coil and the second layer of coil are configured such that the primary coil and the shield coil have current components in a circumferential direction of the side walls of the substrate that minimize a leakage field.

13. The gradient coil according to claim 1, wherein the gradient coil is X gradient coil.

14. The gradient coil according to claim 1, wherein the gradient coil is Y gradient coil.

15. The gradient coil according to claim 1, wherein the gradient coil is Z gradient coil.

16. The gradient coil according to claim 1, further comprising passive shims which are co-planar with the first and/or second layers of coils and inserted in a spiral trajectory parallel to the wires of the first and/or second layers of coils.

17. The gradient coil according to claim 2, wherein slots for passive shims run between wires of the primary and shield coils.

18. The gradient coil according to claim 1, wherein low order passive shims are located on the ends of the gradient coil.

19. The gradient coil according to claim 1, which is combined with conventional Golay windings or Crescent coils.

20. The gradient coil according to claim 1, wherein conductors cross between the first and second layers of coils or electrical connections are made between the first and second layers of coils.

21. The gradient coil according to claim 1, wherein slots are cut into the ends of the substrate such that some wires of the gradient coil do not reach the end.

22. The gradient coil according to claim 1, wherein cut-outs are made into the end of the substrate to accommodate shoulders of a patient.

23. The gradient coil according to claim 1, wherein some wires of the gradient coil are selected so that the wires can be switched or changed polarity to change the size, shape or position of the field of view.

24. The gradient coil according to claim 1, wherein some wires of the gradient coil are selected so that the wires can be driven in parallel.

25. The gradient coil according to claim 1, wherein the substrate is sub-divided such that multiple gradient coils can be arranged in series along the length of the substrate.

26. The gradient coil according to claim 1, wherein the wires of the gradient coil are single-filamentary conductor, multi-filamentary conductor, hollow conductor or machined from metal plate.

27. The gradient coil according to claim 1, wherein the wires of the gradient coil are manufactured from electrically conductive materials.

28. The gradient coil according to claim 27, wherein the electrically conductive materials include copper, aluminum or alloys comprising copper or aluminum.

29. The gradient coil according to claim 1, wherein the wires of the gradient coil are wound from a high or low temperature superconducting material.

30. The gradient coil according to claim 1, further comprising cooling tubes which are wound in a spiral configuration, between the wires of the gradient coil.

31. The gradient coil according to claim 1, wherein an azimuthal angle subtended by the first portion of each turn of wire in the first plurality of turns of wires and the second plurality of turns of wires is larger than an azimuthal angle subtended by the second portion thereof 32. An MR apparatus comprising:
an X gradient coil; and
a Y gradient coil;
wherein the X gradient coil and the Y gradient coil are gradient coils comprising:
a first layer of coil comprised of a first plurality of turns of wires, wherein the first plurality of turns of wires spirals in a substantially parallel trajectory along an inner side wall of a cylindrical substrate in a first helical direction from one of an upper edge and a lower edge of the cylindrical substrate to the other of the upper and lower edges, where the first plurality of turns of wires traverses the substrate and then spirals along an outer side wall of the cylindrical substrate in a second helical direction to the one of the upper edge and the lower edge, so that each turn of wire in the first plurality of turns of wires circles along the side walls of the cylindrical substrate and includes a first portion wound along the inner side wall and a second portion wound along the outer side wall; and
a second layer of coil comprised of a second plurality of turns of wires, wherein the second plurality of turns of wires spirals in a substantially parallel trajectory along the inner side wall of the cylindrical substrate in the second helical direction from one of the upper and lower edges of the cylindrical substrate to the other of the upper and lower edges, where the second plurality of turns of wires traverses the substrate and then spirals along the outer side wall of the cylindrical substrate in the first helical direction to the one of the upper and lower edges, so that each turn of wire in the second plurality of turns of wires circles along the side walls of the cylindrical substrate and includes a first portion wound along the inner side wall and a second portion wound along the outer side wall.

33. The MR apparatus according to claim 32, wherein the Y gradient coil shares the same substrate with the X gradient coil and wherein the wires of the Y gradient coil are interleaved with those of the X gradient coil 34. The MR apparatus according to claim 32, further comprising a Z gradient coil which is a gradient coil comprising:
a first layer of coil comprising a first plurality of turns of wires, wherein the first plurality of turns of wires spirals in a substantially parallel trajectory along an inner side wall of a cylindrical substrate in a first helical direction from one of an upper edge and a lower edge of the cylindrical substrate to the other of the upper and lower edges, where the first plurality of turns of wires traverses the substrate and then spirals along an outer side wall of the cylindrical substrate in a second helical direction to the one of the upper edge and the lower edge, so that each turn of wire in the first plurality of turns of wires circles along the side walls of the cylindrical substrate and includes a first portion wound along the inner side wall and a second portion wound along the outer side wall; and a second layer of coil comprising a second plurality of turns of wires, wherein the second plurality of turns of wires spirals in a substantially parallel trajectory along the inner side wall of the cylindrical substrate in the second helical direction from one of the upper and lower edges of the cylindrical substrate to the other of the upper and lower edges, where the second plurality of turns of wires traverses the substrate and then spirals along the outer side wall of the cylindrical substrate in the first helical direction to the one of the upper and lower edges, so that each turn of wire in the second plurality of turns of wires circles along the side walls of the cylindrical substrate and includes a first portion wound along the inner side wall and a second portion wound along the outer side wall.

35. The MR apparatus according to claim 34, wherein the Z gradient coil is encapsulated or partially encapsulated inside the X gradient coil and Y gradient coil.

36. The MR apparatus according to claim 32, further comprising room temperature shim coils which are encapsulated or partially encapsulated inside the X gradient coil and the Y gradient coil.

37. The MR apparatus according to claim 32, wherein the X gradient coil and the Y gradient coil have a geometry which is asymmetric about the XY plane.

38. The MR apparatus according to claim 32, further comprising a bore of which central portion is bulged to allow reduced claustrophobia or installation of RF coil or additional imaging equipment.

39. The MR apparatus according to claim 38, wherein the additional imaging equipment includes a PET scanner or a focused ultrasound device.

40. The MR apparatus according to claim 32, further comprising a bore which has a tapered entry to increase openness.

41. The MR apparatus according to claim 32, further comprising a bore which is elliptical or a bottom potion of which is elliptical or flattened to bring conductors under a patient bed of the MR apparatus closer to the field of view.

* * * * *